(12) United States Patent
Davis et al.

(10) Patent No.: US 7,254,886 B2
(45) Date of Patent: Aug. 14, 2007

(54) INTERFACE DEVICE WITH A RELEASABLE MOUNT

(75) Inventors: Peter Davis, Santa Cruz, CA (US); Dean Tarrant, San Jose, CA (US)

(73) Assignee: UI Holding Co., Conklin, NY (US)

( * ) Notice: Subject to any disclaimer, the term of this patent is extended or adjusted under 35 U.S.C. 154(b) by 307 days.

(21) Appl. No.: 10/810,292

(22) Filed: Mar. 26, 2004

(65) Prior Publication Data

US 2004/0188017 A1    Sep. 30, 2004

Related U.S. Application Data

(60) Provisional application No. 60/458,659, filed on Mar. 28, 2003.

(51) Int. Cl.
*B23P 19/00*     (2006.01)
*B32B 1/00*      (2006.01)

(52) U.S. Cl. .......................................... 29/739; 156/344

(58) Field of Classification Search .................. 29/739, 29/759, 740, 741, 784, 760; 403/381, 353, 403/316; 156/344, 584

See application file for complete search history.

(56) References Cited

U.S. PATENT DOCUMENTS

| | | | |
|---|---|---|---|
| 3,387,906 A * | 6/1968 | Edwards | 312/334.25 |
| 6,173,750 B1 | 1/2001 | Davis et al. | |
| 6,347,624 B1 * | 2/2002 | Smith et al. | 125/13.01 |
| 6,681,481 B1 * | 1/2004 | Rachkov et al. | 29/784 |

* cited by examiner

*Primary Examiner*—John C. Hong
(74) *Attorney, Agent, or Firm*—Basch & Nickerson LLP; Duane C. Basch

(57) ABSTRACT

In recapitulation, the present invention is a method and apparatus for the reliable removal and installation of a component feeding system, such as a direct die feeder, within a printed circuit board or similar assembly machine such as those used in the assembly of printed circuit boards. The invention employs a docking channel operatively affixed to the assembly machine, where the docking channel includes at least a pair of parallel grooves into which alignment rails on the component feeder may be inserted. In this way, the position of the component feeder may be controlled. The docking channel may further include stops, safety locks, alignment pins and a transport device to facilitate easy removal and exchange of component feeders on an assembly machine.

18 Claims, 5 Drawing Sheets

INTERFACE DEVICE WITH A RELEASABLE MOUNT

CROSS REFERENCE

Priority is claimed from Provisional Application Ser. No. 60/458,659 "INTERFACE DEVICE WITH A RELEASABLE MOUNT THEREIN," filed on Mar. 28, 2003, by P. Davis et al., is hereby incorporated by reference in its entirety.

BACKGROUND OF THE INVENTION

The present invention is particularly useful in the assembly of printed circuit boards (PCB), or more particularly, the surface mounting of integrated circuits (ICs) on substrates, including PCBs. More particularly, the invention relates to the attachment and interfacing of component feeding systems to a PCB assembly machine whereby electrical components, being bare die or packaged, are removed from a medium and transferred to a pick-up location. This invention generally facilitates the portability of a bare die feeding system, and the like, where the mounting of such feeders to an assembly machine is readily accomplished with minimal time and highly repeatable positioning.

The presentation of electrical and mechanical components using a feeding subsystem is commonly used in a variety of manufacturing processes where an assembly work cell is supplied by a plurality of component delivery systems, which collectively provide parts to the host assembly machine. In the mass production of printed circuit boards automated assembly machinery accepts electrical devices from tape and reel feeders and positions them at a predetermined location on the circuit board. One advantage of the tape and reel feeder system is that they are simplistic and consume a relatively small amount of space, thus a large number of tape feeders can be placed adjacent to one another and utilized by a single assembly machine. Additionally, tape feeders are typically provided by the manufacturer of the assembly machine, thereby ensuring that the feeding system is directly compatible with the host machine and accordingly are readily installed and removed for loading, maintenance, and production run change over.

Surface mount components are typically supplied within a pocketed tape rolled onto a reel that can be loaded in to a tape and reel component feeder that is mounted within a corresponding feeder slot of the PCB assembly machine. Component placement machines can have many feeder slots, each of which are accessible by the placement head that picks individual components from the feeders and places them according to pre-programmed instructions. For application flexibility, each feeder slot is compatible with a plurality of different feeder configurations to accommodate a broad spectrum of component sizes. Therefore the physical arrangement of components, feeders and slots must be in accordance with the expected arrangement as programmed within the set-up file that is representative of the PCB configuration. Accordingly the entire feeder platform is required to be compliant and yet versatile in light of the constantly evolving set-up requirements.

An aftermarket bare die feeding system, such as the one disclosed in U.S. Pat. No. 6,173,750, to Davis et al., hereby incorporated by reference for its teachings, takes the place of a plurality of tape feeders and is advantageous because it eliminates the steps of first placing the die into a carrier tape medium for subsequent removal by the placement head. Accordingly, the direct die feeder of Davis, et al., is capable of performing the function of presenting die directly from a wafer and thus eliminating the intermediate step of staging the die within a tape on reel format. For this reason, it is called a direct die feeder, or DDF. Such a feeder reduces the handling of bare die, thereby significantly reducing costs and improving the reliability of the end product.

Based on the fact that a DDF is intended to be an after market solution to replace existing OEM tape feeders, it is designed to maintain the narrow form-factor of a tape and reel feeding system found on PCB assembly machines such as the Universal GSM, Fuji CP-6 or the Siemens Siplace pick and place machines. The narrow width of such feeders, typicafly less than 100 mm, enables a plurality of direct die feeders to be positioned side by side or along with tape feeders and thus accessible by a single pick and place machine. By maintaining the narrow form factor, the same or fewer placement machines are needed in the assembly line. This significantly affects the overall cost and time consumed in the production of circuit boards containing bare die components when compared to an "off line," stand alone approach.

Such direct die feeding systems have been designed so as to appear to the placement machine as being functionally equivalent to a conventional tape and reel feeding system. However, from a technology perspective the actual removal of the bare die from the wafer and conveying it to the pick point is a rather intricate process which relies on substantially the same level of technology as is found in the placement machine to which it is attached. For example, removing bare die from a wafer requires machine vision, an x and y gantry, pneumatics, two or more stepper motors, a conveyance system and an on-board computer. Therefore a direct die feeder represents a significant departure from the technology required to simplistically deliver a component, such as a bare die, from a tape and reel feeding mechanism. In light of this complexity and advanced technology reliability issues and associated service opportunities are a foremost concern when compared to a tape feeder.

Prior attempts at delivering chips or components directly from wafer to circuit board have either not been successfully implemented or the industry has not accepted them because they are often aftermarket accessories having a rather unwieldy footprint with difficult interfacing that consumes significant space on the feeder platform. This difficulty in integration results in reduced interest in use of integrated direct die feeding systems. However, the present invention is based on discoveries which overcome the disadvantages of the present "dedicated" fixed mounting of direct die feeding system by significantly improving the installation and integration of direct die and similar feeders within the existing placement machinery, without requiring a permanently committed space within the feeder bay. With the utilization of the present patent a direct die feeding system enjoys substantially the same portability attributed to a traditional tape and reel feeder.

SUMMARY OF THE INVENTION

The present invention capitalizes on an opportunity to improve the portability of a direct die or similar component feeder using a unique mounting method. Through the use of a novel releasable mount, in practice the direct die feeder can now be considered a portable apparatus which is readily removed and installed at will, absent of any concerns relative to alignment, operational integrity, electrical connectivity or excessive down time.

In accordance with the present invention, there is provided a releasable, sliding mount for connecting a component feeding system to an assembly machine in a repeatable manner, comprising: a docking channel operatively affixed to the assembly machine, said docking channel including a pair of parallel grooves therein; a positioning member associated with the docking channel; and a plurality of rollers affixed to the component feeding system, whereby upon insertion of the component feeding system into the docking channel, said rollers are received by said grooves within the docking channel.

In accordance with another aspect of the present invention, there is provided an universal interface base plate assembly for mounting the die feeder system into a variety of host assembly machines, whereas the interface base plate adaptably secures two or more docking channels to a plurality of diverse assembly machine platforms, where the mounting device of the base plate further comprises one or more fastening screws inserted into a taped bore, or a bolt plate orientated within a T-slot on the feeder mounting platform.

One aspect of the invention deals with a basic problem where oftentimes it is desirable to readily interchange bare die feeding systems from within the assembly machine. For instance a feeder might possibly be "tooled" for a specific size of component or adapted for a unique application. In these instances it would be advantageous to interchange feeding systems based on the application specific requirements of the job set-up, as is the established practice with tape and reel feeders. Generally, it is less burdensome to interchange feeding systems than to consistently re-program and re-tool the operational parameters of the bare die feeder. Additionally, when continuous on-line operation is a priority, the releasable sliding mount provides the practical advantage of being able to exchange or "hot swap" a die feeding systems while the assembly machine is actively installing other components on the circuit boards.

Another aspect of the invention is based on the observation that abnormal operation of an "embedded" die feeding system, and subsequent service, could indefinitely halt the entire circuit board assembly line. Furthermore, due to the close proximity of the feeders to one another, accessibility to serviceable parts within the feeder is difficult and time intensive. Therefore it is advantages to be able to slide the feeder back for problem analysis or even better in the case of more extensive correction actions, remove the feeder completely for repair within a service department or a service exchange with the manufacturer.

A number of other advantages are achieved by having the capability to remove the die feeder from the placement machine. First, the feeder may not always be required for the current job and would need to be placed into a holding area or secondly the feeder maybe be required on another line. This portability provides for the best possible utilization of this capital investment.

It is therefore an object of the present invention to provide an apparatus for mounting a die feeding system into an assembly machine so that it is easily and quickly removed.

It is a further an object of the present invention to provide an assembly machine specific interface base plate in order to adapt the die feeder generic docking channel to a wide range of pick and place assembly machines.

Still another objective of the present invention is to provide a mounting device that allows the die feeder system to be removed by deflecting a safety stop arm from its locked position.

A still further object of the invention to establish parallelism between dies feeders utilizing a common vertical member of the docking channel and thereby consuming an absolute minimum of space between consecutively mounted die feeders.

Another object of the invention is to provide a transporting means to move the die feeding system from a first location to a second.

And lastly, it is a further objective of the invention is to provide a means to install conventional tape and reel feeders within and there between the docking channel assemblies when the die feeder is not present.

Additional objects, advantages, and novel features of the invention will be set forth in the description and drawings which follows and will become apparent to those skilled in the practice of this releasable mounting technique for a die feeder and similar systems.

Figure 1:
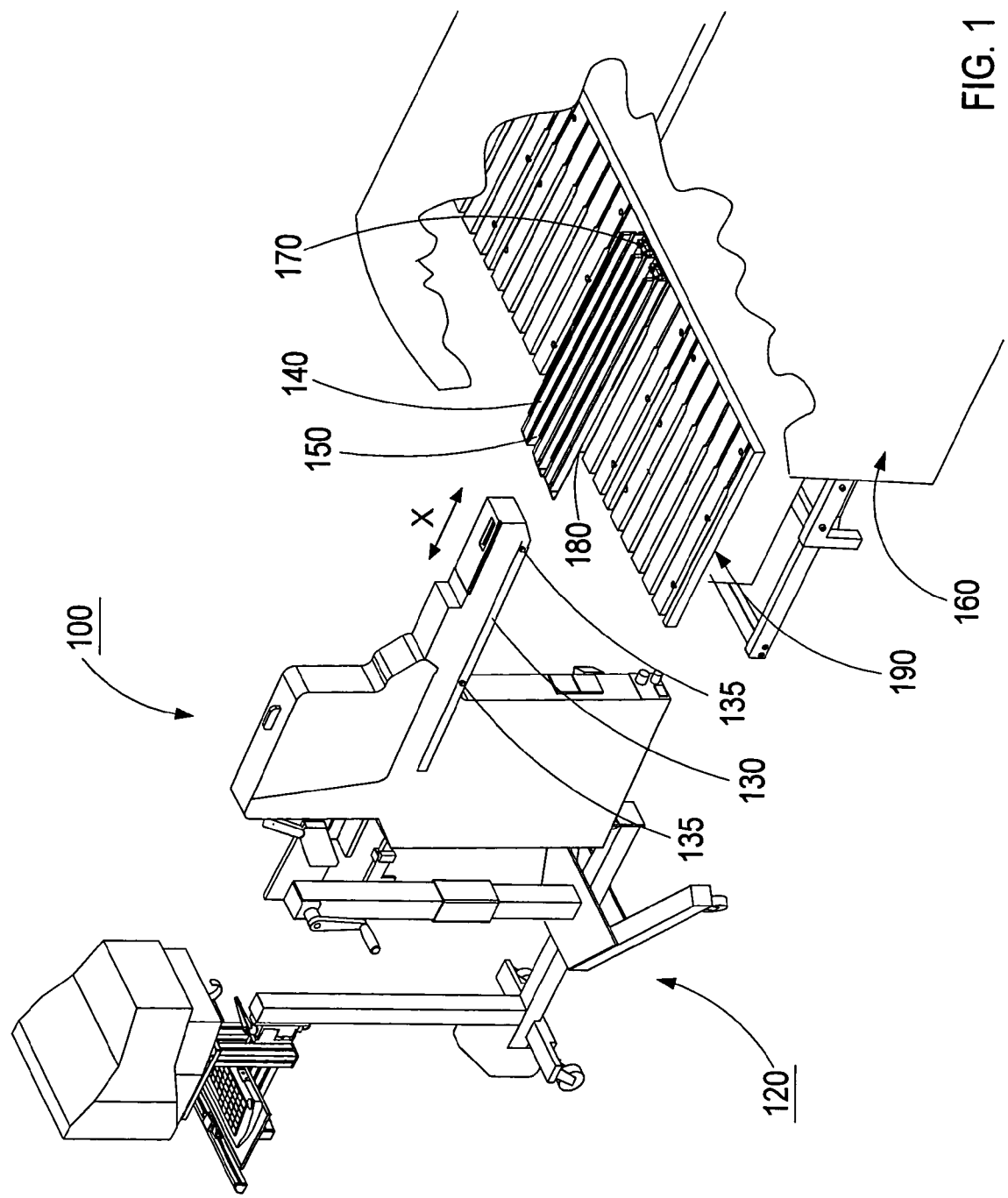
FIG. 1 is an exemplary embodiment illustrating the removal and installation of a die feeding system into and out of an assembly machine by employing a feeder transport.

The present invention will be described in connection with a preferred embodiment, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. Thus, for the purpose of this invention, use of the word, "die" is intended to include to any type of device picked from a flexible film, and component feeder is intended to include die feeders as well as tape and similar component feeding devices, and such feeders are not limited by the types of components they feed.

Turning now to FIG. 1, there is depicted a bare die feeding system 100 for removing singularized bare die from a silicon wafer mounted within a wafer ring and presenting the die for placement on the printed circuit board by a PCB assembly machine 160. In this configuration the bare die feeding system 100 is secured to feeder transport 120 for portability to and from the PCB assembly machine 160, as well as mobility of the bare die feeding system 100 about the production floor and into a staging area or maintenance department. In one embodiment, the feeder transport 120 also serves as a storage fixture and/or service cart for the bare die feeding system 100 when not installed on the PCB assembly machine 160. PCB assembly machine 160 has a feeder platform 190 attached to a frontal region in order to accommodate the installation of the required feeder for a specific set-up.

In the case of a non-traditional tape and reel feeder, as may be the case with the bare die feeding system 100, a docking channel 150 is affixed to the feeder platform 190 in anticipation of the installation and mounting of a die feeding system 100 when desired. The docking channel includes one or more vertical members 140 attached to a base plate 180. The vertical members 140 contains longitudinal grooves 310 having a profile that compliments and receives the wheels 135 of the bare die feeder 100. A roller alignment rail 130 is attached to the bare die or other component feeder 100. Alternatively, the wheels 135 may be directly affixed to the component feeder 100 in such a position so as to support the entire load of the bare die feeding system 100 when inserted within the docking channel 150 and once securely affixed to the feeder platform 190. Once the load of the bare die feeding system 100 has been transferred from the feeder transport 120 through the rollers 135 and onto the docking channel 150, the feeder transport 120 is no longer required and therefore may be removed and stored for subsequent use. Now the bare die feeding system 100 is constrained, but yet movable for indexing or positioning within the docking channel 150.

Figure 3:
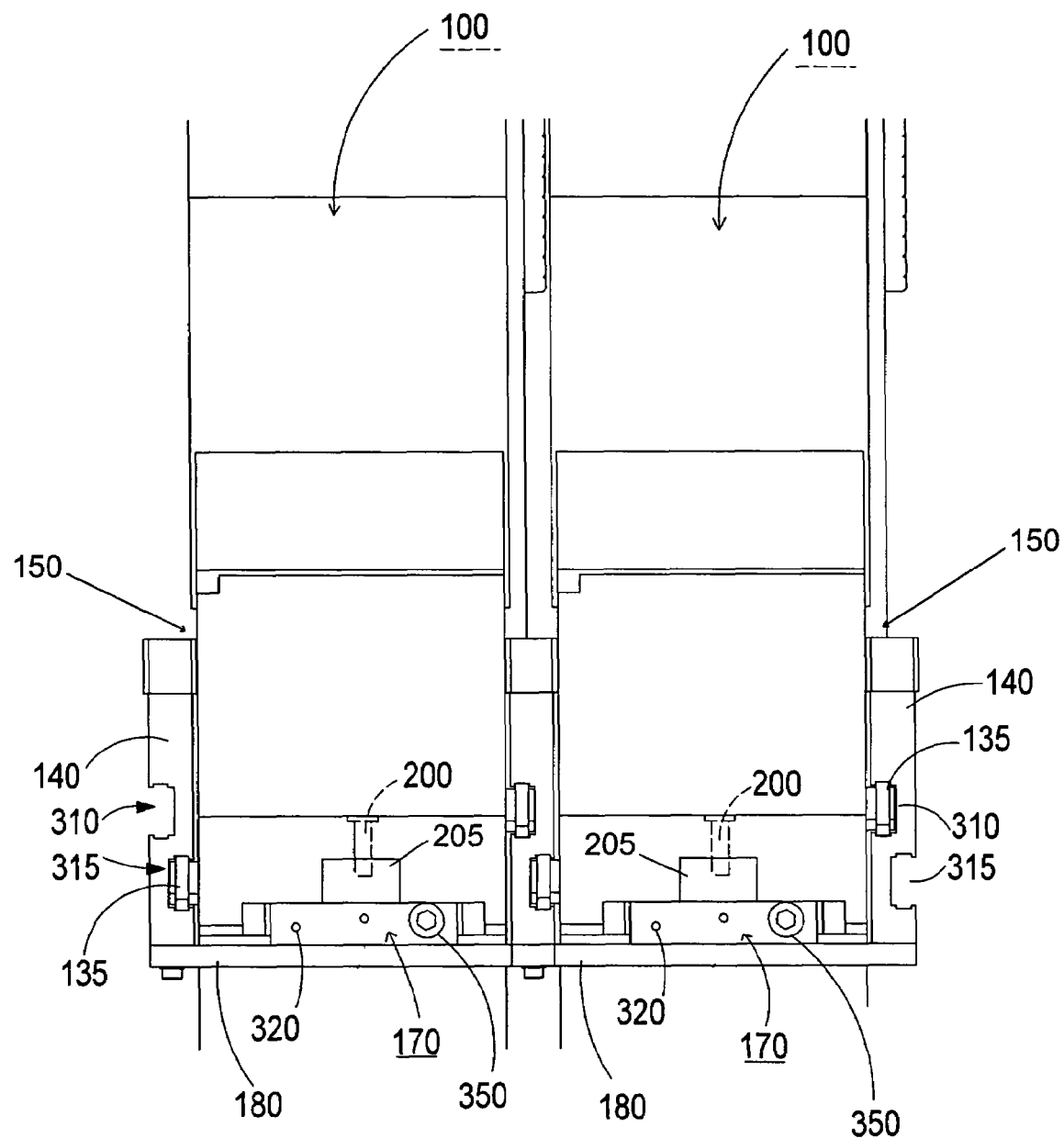
FIG. 3 is an internal planar view illustrating the die feeder in alignment with the positioning member.

Once the distal end of the bare die feeding system 100 is in the fully inward position, as shown in FIG. 3, positioning member 170 establishes at least two dimensional positioning to a repeatable accuracy of +/−0.001". This positional accuracy is accomplished using a positioning member assembly 170 and at least one alignment pin 320. The positioning member includes a bracket 205 having a recess therein for receiving a latch pawl or pin 200, so as to limit or control the inward position of the component feeding system in relation to the docking channel. The operation of the latch serves to assure the positioning of the component feeder relative to the docking channel, and in operation the control of the position of pin 200 is accomplished using a pneumatic cylinder, solenoid or similar mechanism that may control the up/down position of the latch pin 200. Pin 200 is received within the recess of bracket 205 and a bias or similar force is applied relative to the feeder 100, using a spring or a dash-pot assembly, so as to bias the component feeder against the locking pin 200 within the recess and thereby assuring its position.

The positioning member further includes alignment pin 320 for engaging the component feeding system 100, whereby the alignment pin accurately indexes the component feeding system in response to the pin projecting into a V-shaped recess or similar tapered hole. Finally, with the bare die feeding system 100 located, latch 200 secures and retains the bare die feeding system 100 in alignment with the PCB assembly machine 160.

Figure 2:
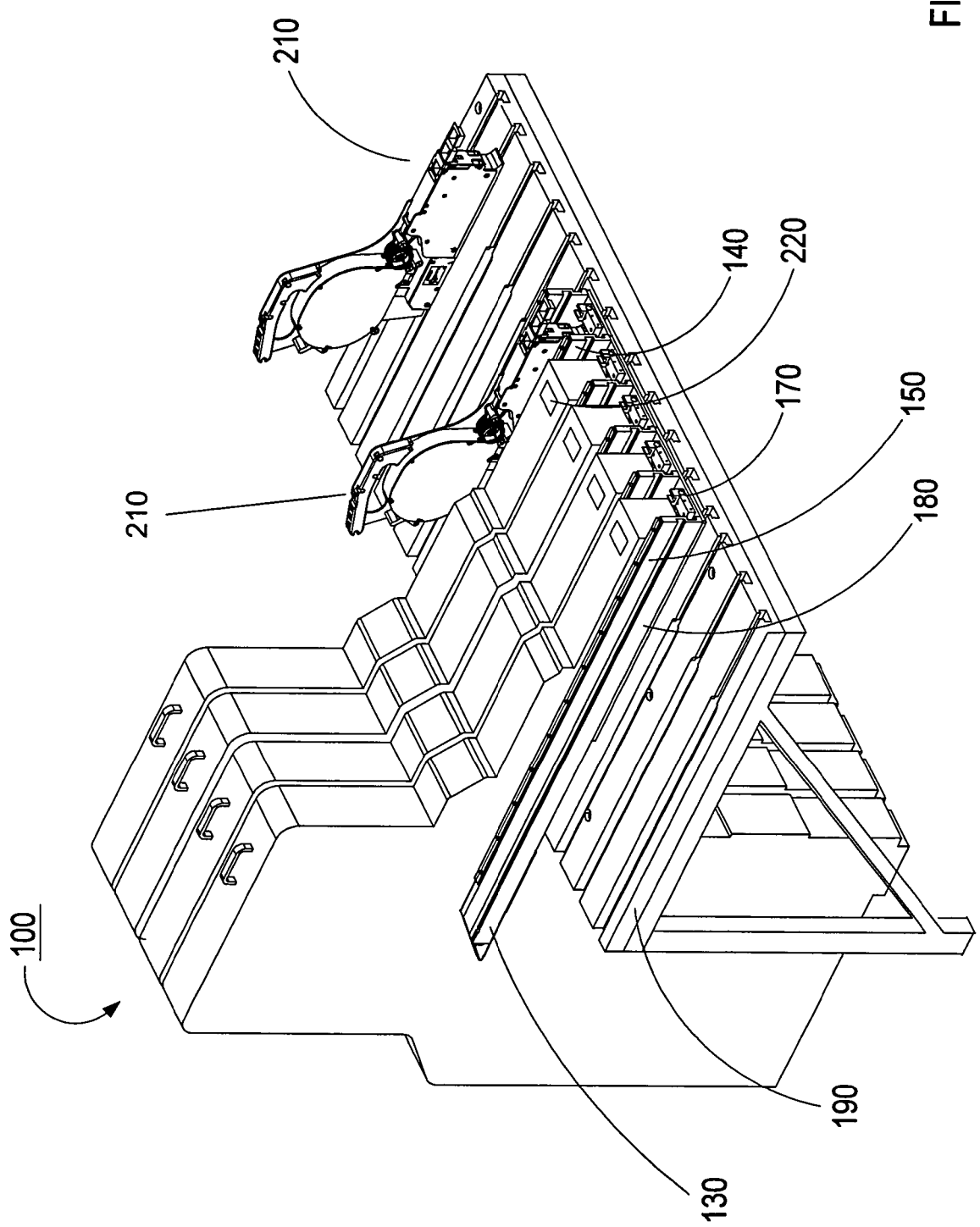
FIG. 2 in accordance with the present invention; illustrates a plurality of die feeding machines installed by means of the releasable sliding mount.

Considering briefly FIG. 2, there is shown the same perspective as in FIG. 1, however the bare die feeding systems 100 are now depicted in their respective locked operational positions within the feeder platform along side of traditional tape and reel feeders 210. Given the ease of installation, the total time to interchange a die feeding system 100 is considerably less than a minute, which is comparable to the time required to install a traditional tape and reel feeder 210.

Referring once again to FIG. 3, the mounting features of the present invention are further shown from the perspective of the placement head contained within the PCB assembly machine 160. In accordance with the invention, each bare die feeding system 100, or feeders with a similar form factor, would have affixed to them a pair roller alignment rails 130 providing at least two roller type members within each rail, and having a rolling portion and a fixed axle about which roller 135 revolves. As shown, the roller alignment rails 130 and the associated grooves 310, in the vertical members 140, are offset in such a way so that groove 310 on one side of the common vertical member 140 will not interfere with groove 310 on the opposite side, thereby maintaining an absolute minimum required thickness of the vertical member 140 and the adjacent die feeding systems 100 as close as possible to one another. The positioning member 170 essentially assures a repeatable position on each insertion or exchange of a die feeding system 100. To accomplish this the inward location is maintained by latch pin 200 which becomes the fiducial for the inward (X-axis) position. In like manner the alignment pin 320 extend into a bore contained within the distal end of the bare die feeding system 100 and provide a reference for the Y position. The Z axis position is primarily controlled as a function of the engagement between the rollers 135 and the channel 310, thereby establishing the location of pick point 220 as it relates to the pick head of the PCB assembly machine 160.

Figure 4:
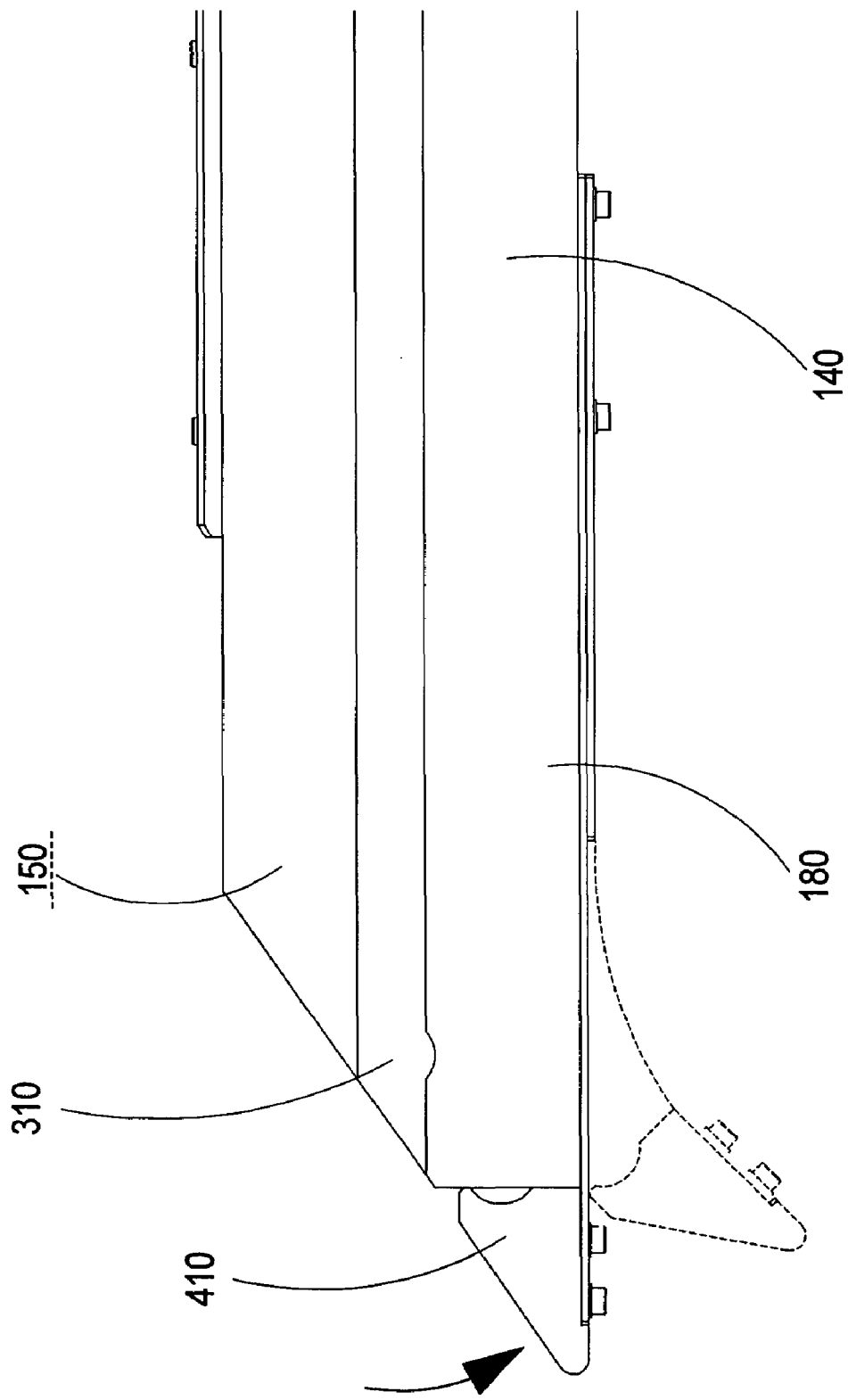
FIG. 4 is a side view of the docking channel and the safety stop.

As a further aspect of the present invention there is shown in FIG. 4 a safety stop 410 to ensure that the bare die feeding system 100 will not inadvertently be or become disengaged from the docking channel 150. At the time the bare die feeding system 100 is in the fully extended position and has been securely placed on the feeder transport 120, the safety stop 410 is moved away from the die feeding system 100 to enable removal of die feeding system 100.

Figure 5:
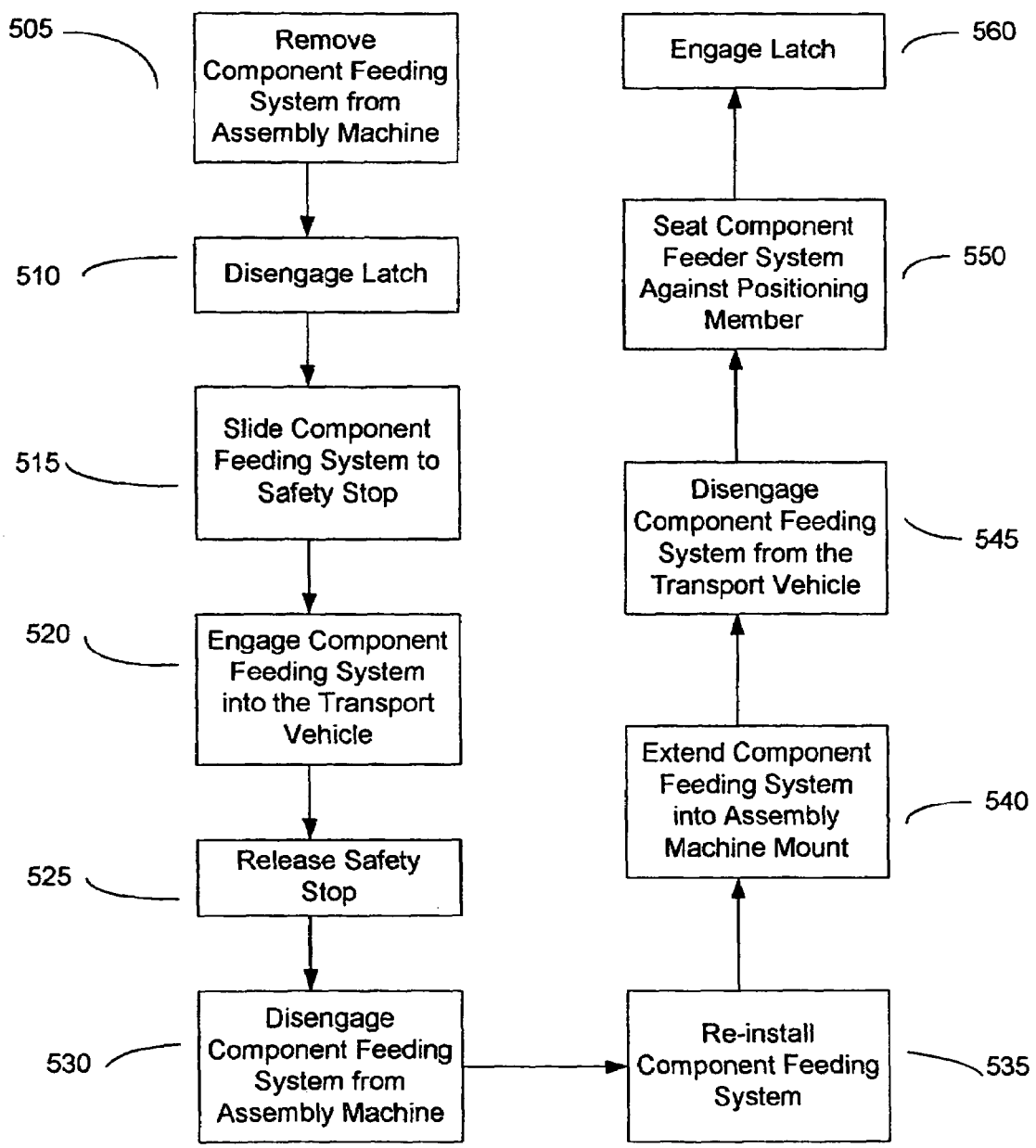
FIG. 5 represents a generalized flowchart illustrating the hierarchical process carried out in accordance with the operation of the present invention.

With reference to the flow chart of FIG. 5, in step 505 the die feeding system 100 is disengaged from the PCB assembly machine 160 when latching mechanism 200 is first released in step 510 to allow the die feeding system 100 to slide back away from the PCB assembly machine 160 and rest against the safety stop 410, step 515. The feeder transport 120 is then moved into position in front and under the die feeding system 100 and the safety stop 410 is released, step 525. In step 530 the feeder transport relieves the PCB assembly machine of the die feeder and holds the die feeder in a secure position. Re-installation of the die feeding system 100, or of another die feeder in steps 535 through 560 only requires the insertion of the rollers into the docking channel 150 whereby the safety stop 410 is automatically displaced. Once the feeder transport 120 is removed in step 545, the die feeding system 100 is located and locked in the home position in step 550.

In recapitulation, the present invention is a method and apparatus for the reliable removal and installation of a component feeding system, such as a direct die feeder, within an assembly machine such as those used in the assembly of printed circuit boards. The invention employs a docking channel operatively affixed to the assembly machine, where the docking channel includes at least a pair of parallel grooves into which alignment rails rollers on the component feeder may be inserted. In this way, the position of the component feeder may be controlled. The docking channel may further include stops, safety locks, alignment pins and a transport device to facilitate easy removal and exchange of component feeders on an assembly machine.

It is, therefore, apparent that there has been provided, in accordance with the present invention, a method and apparatus for releasably mounting a component feeding system. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A releasable, sliding mount for connecting a component feeding system to an assembly machine in a repeatable manner, comprising:
  a feeder platform attached to the assembly machine;
  a docking channel operatively affixed to the feeder platform, said docking channel including a pair of parallel grooves therein;
  a positioning member associated with the docking channel; and
  a plurality of rollers affixed to the component feeding system, whereby upon insertion of the component feeding system into the docking channel, said rollers are received by said grooves within the docking channel.

2. The releasable, sliding mount of claim 1, further comprising means for locking the component feeding system into a defined position, wherein the position is controlled by the positioning member.

3. The releasable, sliding mount of claim 1, further comprising a safety stop for preventing the inadvertent removal of the component feeding system from the docking channel, wherein said safety stop is displaced so as to allow the component feeding system to be completely removed from the docking channel.

4. The releasable, sliding mount of claim 1, wherein the docking channel comprises a base plate and two vertical members.

5. The releasable, sliding mount of claim 4, wherein said vertical members are generally parallel to one another and have said grooves extending along a longitudinal axis, wherein said grooves are staggered and on opposite sides of said vertical member so as to enable the grooves on each side of the vertical member to receive roller alignment rails from adjacent component feeding systems.

6. The releasable, sliding mount of claim 5, wherein said roller alignment rails move reciprocally along said grooves.

7. The releasable, sliding mount of claim 1, wherein said positioning member comprises a bracket and a latch pin to control the inward position of the component feeding system in relation to said docking channel.

8. The releasable, sliding mount of claim 7, wherein said positioning member further comprises at least one alignment pin for engaging said component feeding system, and where said alignment pin further positions said component feeding system.

9. The releasable sliding mount of claim 1, wherein said positioning member further comprises a latching mechanism operably engaging said component feeding system, whereby said latching mechanism, when engaged, inhibits relative motion between the component feeding system and the docking channel.

10. A mounting device for connecting a plurality of component feeding systems to an assembly machine in a repeatable manner, comprising:
  a feeder platform attached to the assembly machine;
  a plurality of docking channels operatively affixed to the feeder platform, each of said plurality of docking channels being separated by a common vertical member, said common vertical member having longitudinal grooves extending along opposite sides thereof;
  a positioning member associated with each of the docking channels;
  a plurality of roller alignment rails affixed to each of the component feeding systems, wherein said roller alignment rails are received by said longitudinal grooves upon insertion of the component feeding systems into the docking channels.

11. The mounting device of claim 10, further comprising means for locking the component feeding systems into positions defined by the respective positioning members.

12. The mounting device of claim 10, further comprising a safety stop associated with each docking channel for preventing the inadvertent removal of the component feeding systems from the docking channels, wherein said safety stop is displaced so as to allow the component feeding systems to be completely removed from the docking channel.

13. The mounting device of claim 10, wherein a plurality of types of component feeding systems may be interchangeably mounted to the assembly machine using the mounting device.

14. The mounting device of claim 10, wherein said docking channel comprises a base plate and at least two vertical members associated therewith.

15. The mounting device of claim 14, wherein said vertical members each have at least two longitudinal grooves therein and where said grooves are staggered on opposite sides of said vertical member.

16. The mounting device of claim 10, wherein said roller alignment rails move reciprocally within said grooves.

17. The mounting device of claim 10, wherein said positioning members comprise a bracket and a latch wherein said latch limits the inward position of the component feeding system in relation to said docking channel.

18. The mounting device of claim 17, wherein said positioning members further comprise one or more alignment pins for engaging said component feeding systems, and where said alignment pins further position said component feeding systems.

* * * * *